(12) United States Patent
Kim

(10) Patent No.: US 12,453,206 B2
(45) Date of Patent: Oct. 21, 2025

(54) METHOD OF MANUFACTURING III-V GROUP NANOROD SOLAR CELL SO THAT SUBSTRATE CAN BE REUSED

(71) Applicant: Korea Photonics Technology Institute, Gwangju (KR)

(72) Inventor: Hyo Jin Kim, Gwangju (KR)

(73) Assignee: Korea Photonics Technology Institute, Gwangju (KR)

( * ) Notice: Subject to any disclaimer, the term of this patent is extended or adjusted under 35 U.S.C. 154(b) by 358 days.

(21) Appl. No.: 18/196,760

(22) Filed: May 12, 2023

(65) Prior Publication Data
US 2023/0290900 A1  Sep. 14, 2023

Related U.S. Application Data

(63) Continuation of application No. PCT/KR2022/009938, filed on Jul. 8, 2022.

(30) Foreign Application Priority Data

Jul. 14, 2021 (KR) ........................ 10-2021-0092053

(51) Int. Cl.
*H10F 71/00* (2025.01)
*H10F 10/163* (2025.01)
(Continued)

(52) U.S. Cl.
CPC ....... *H10F 77/1437* (2025.01); *H10F 71/127* (2025.01); *H10F 71/1395* (2025.01);
(Continued)

(58) Field of Classification Search
CPC .... H10F 71/139; H10F 10/163; H10F 71/127; H10F 71/137; H10F 77/1437;
(Continued)

(56) References Cited

U.S. PATENT DOCUMENTS 7,521,274 B2 * 4/2009 Hersee ................ H10D 62/122
438/479
7,615,400 B2 * 11/2009 Goto ..................... H10F 77/148
438/69
(Continued)

FOREIGN PATENT DOCUMENTS

JP     2010541194 A  * 12/2010  ........... H10D 62/122
KR  10-2010-0138703 A     12/2010
(Continued)

*Primary Examiner* — Earl N Taylor
(74) *Attorney, Agent, or Firm* — Dinsmore & Shohl LLP; Yongsok Choi, Esq.

(57) ABSTRACT

Disclosed is a method of manufacturing a III-V group nanorod solar cell so that a substrate can be reused. The method may includes a first growth process of forming an etch stop layer on a substrate, a second growth process of growing a sacrificial layer on the etch stop layer, a third growth process of forming, on the sacrificial layer, a pattern layer including an opening at each location at which each nanorod solar cell is able to be grown, a fourth growth process of growing the nanorod solar cells on the sacrificial layer through the openings within the pattern layer, a forming process of forming a solar cell protection layer on outsides of the nanorod solar cells, a first etching process of etching the sacrificial layer and the pattern layer, and a second etching process of etching the etch stop layer.

12 Claims, 9 Drawing Sheets

(51) Int. Cl.
*H10F 77/124* (2025.01)
*H10F 77/14* (2025.01)
*H10F 77/30* (2025.01)

(52) U.S. Cl.
CPC ......... *H10F 77/124* (2025.01); *H10F 77/311* (2025.01); *Y02E 10/544* (2013.01)

(58) Field of Classification Search
CPC .. H10F 71/1395; H10F 77/124; H10F 77/311; Y02E 10/544; H01L 31/1896; H01L 31/184; H01L 31/035227; H01L 31/0304; H01L 31/02167; H01L 31/1892; H01L 31/0735; H01L 31/1876; H01L 31/0352; H01L 31/035281; H01L 31/0687; H01L 31/0693; H01L 31/18; H01L 31/1852
See application file for complete search history.

(56) References Cited

U.S. PATENT DOCUMENTS

| | | | | |
|---|---|---|---|---|
| 8,455,284 B2* | 6/2013 | Seong | ................. | H10H 20/825 438/47 |
| 2008/0110486 A1* | 5/2008 | Tsakalakos | ........... | H10F 10/142 136/255 |
| 2011/0126891 A1* | 6/2011 | Goto | .................... | H10F 77/147 438/94 |
| 2011/0247548 A1* | 10/2011 | Jung | .................... | C30B 29/605 117/58 |
| 2014/0370716 A1* | 12/2014 | Lee | .................... | H10F 71/1395 438/715 |
| 2019/0051724 A1* | 2/2019 | Do | ........................ | H10D 64/20 |

FOREIGN PATENT DOCUMENTS

| | | | | |
|---|---|---|---|---|
| KR | 10-1023144 B1 | | 3/2011 | |
| KR | 20120028062 A | * | 3/2012 | ........... H10F 71/138 |
| KR | 10-2014-0128393 A | | 11/2014 | |
| KR | 10-1455723 B1 | | 11/2014 | |
| KR | 10-1714812 B1 | | 3/2017 | |
| KR | 10-1912482 B1 | | 10/2018 | |
| KR | 20210061057 A | * | 5/2021 | ........... H10F 71/137 |

* cited by examiner

METHOD OF MANUFACTURING III-V GROUP NANOROD SOLAR CELL SO THAT SUBSTRATE CAN BE REUSED

CROSS-REFERENCE TO RELATED APPLICATION

The present application is a continuation of International Application No. PCT/KR2022/009938 filed on Jul. 8, 2022, which claims priority under 35 U.S.C. § 119(a) to Korean Patent Application No. 10-2021-0092053, filed in the Korean Intellectual Property Office on Jul. 14, 2021, the entire disclosure of which is incorporated herein by reference.

This patent is the results of research that was carried out by the support (a unique project number: 1711159488, a detailed project number: 2021M3H4A1A02051253, a project name: an epitaxial structure for a III-V nanorod solar cell) of the National Research Foundation of Korea by the finances of the government of the Republic of Korea (The Ministry of Science and ICT) in 2021.

Furthermore, this patent is the results of research that was carried out by the support (a unique project number: 1711173064, a detailed project number: 2022M3I8A2085436, a project name: the development of a high efficiency IMM 3-5 group compound semiconductor solar cell for space) of the National Research Foundation of Korea by the finances of the government of the Republic of Korea (The Ministry of Science and ICT) in 2022.

BACKGROUND

1. Technical Field

The present disclosure relates to a method of manufacturing a solar cell so that a substrate that is used to manufacture a III-V group nanorod solar cell can be reused in manufacturing the III-V group nanorod solar cell.

2. Related Art

Contents described in this part merely provide background information of the present embodiment, and do not constitute a conventional technology.

A solar cell is a device capable of converting sunlight energy into electricity by a photovoltaic effect. The solar cell has a p-n junction structure in which a p type semiconductor and an n type semiconductor have been bonded together.

The solar cell is manufactured by the following process. A sacrificial layer to be etched by an etchant is grown on a substrate. A solar cell layer is grown on the sacrificial layer. After all of the solar cell layers are grown, the substrate and the solar cells are separated from each other by etching the sacrificial layer by using an etchant.

In this case, a very long time is taken until the sacrificial layer is etched because the etching by the etchant is performed from the outside of the sacrificial layer to the inside of the sacrificial layer. In general, an etching process requires 4 hours or more on the basis of a 2-inch substrate, and requires 16 hours or more on the basis of a 4-inch substrate.

As the substrate on which each layer has been grown is exposed to the etchant for a long time as described above, characteristics of the substrate are changed. Due to such a change in the characteristics of the substrate, the substrate prevents another solar cell from being grown thereon again after the substrate is separated from the solar cells grown on top of the substrate. Manufacturing costs for a solar cell are increased because a substrate needs to be used each time in manufacturing the solar cell due to such a problem.

SUMMARY

An embodiment of the present disclosure is directed to a method of manufacturing a III-V group nanorod solar cell so that a substrate that is used in a process of manufacturing the III-V group nanorod solar cell can be reused.

According to an aspect of the present disclosure, a method of manufacturing a plurality of nanorod solar cells so that a substrate is able to be reused may include a first growth process of forming an etch stop layer on a substrate, a second growth process of growing a sacrificial layer on the etch stop layer, a third growth process of forming, on the sacrificial layer, a pattern layer including an opening at each location at which each nanorod solar cell is able to be grown, a fourth growth process of growing the nanorod solar cells on the sacrificial layer through the openings within the pattern layer, a forming process of forming a solar cell protection layer on outsides of the nanorod solar cells, a first etching process of etching the sacrificial layer and the pattern layer, and a second etching process of etching the etch stop layer.

According to an aspect of the present disclosure, the nanorod solar cell is implemented as gallium arsenide (GaAs).

According to an aspect of the present disclosure, the substrate is implemented as a component identical with the component of the nanorod solar cell.

According to an aspect of the present disclosure, the solar cell protection layer is implemented as a component that is transparent and that has a non-conductive characteristic.

According to an aspect of the present disclosure, a method of manufacturing a plurality of nanorod solar cells so that a substrate is able to be reused may include a first growth process of forming an etch stop layer on a substrate, a second growth process of growing a sacrificial layer on the etch stop layer, a third growth process of forming, on the sacrificial layer, a pattern layer including an opening at each location at which each nanorod solar cell is able to be grown, a fourth growth process of growing the nanorod solar cells on the sacrificial layer through the openings within the pattern layer, a first etching process of etching the sacrificial layer and the pattern layer, a forming process of forming a solar cell protection layer on outsides of the nanorod solar cells after the nanorod solar cells on which the first etching process has been performed are disposed to have a preset interval, and a second etching process of etching the etch stop layer.

According to an aspect of the present disclosure, the solar cell protection layer is a silicon compound.

According to an aspect of the present disclosure, in the first etching process, the sacrificial layer and the pattern layer are etched by an HF mixture.

According to an aspect of the present disclosure, a method of manufacturing a plurality of nanorod solar cells so that a substrate is able to be reused may include a first growth process of sequentially growing, on a substrate, a first layer implemented as a component having a lattice constant identical with a lattice constant of a nanorod solar cell to be manufactured, a second layer implemented as a component identical with a component of the substrate, and a third layer implemented as the same component as the first layer, a second growth process of growing, on the third layer, a pattern layer including an opening at each location at which each nanorod solar cell is able to be grown, a third growth process of growing the nanorod solar cells on the third layer through the openings within the pattern layer, a forming process of forming a solar cell protection layer on outsides of the nanorod solar cells, a first etching process of etching the third layer and the pattern layer, and a second etching process of etching the first layer and the second layer.

According to an aspect of the present disclosure, the nanorod solar cell and the substrate are implemented as indium phosphide (InP).

According to an aspect of the present disclosure, the first layer is implemented as indium gallium arsenide (InGaAs).

According to an aspect of the present disclosure, the solar cell protection layer is implemented as a component that is transparent and that has a non-conductive characteristic.

According to an aspect of the present disclosure, a method of manufacturing a plurality of nanorod solar cells so that a substrate is able to be reused may include a first growth process of sequentially growing, on a substrate, a first layer implemented as a component having a lattice constant identical with a lattice constant of a nanorod solar cell to be manufactured, a second layer implemented as a component identical with a component of the substrate, and a third layer implemented as the same component as the first layer, a second growth process of growing, on the third layer, a pattern layer including an opening at each location at which each nanorod solar cell is able to be grown, a third growth process of growing the nanorod solar cells on the third layer through the openings within the pattern layer, a first etching process of etching the third layer and the pattern layer, a forming process of forming a solar cell protection layer on the outsides of the nanorod solar cells after the nanorod solar cells on which the first etching process has been performed are disposed to have a preset interval, and a second etching process of etching the first layer and the second layer.

According to an aspect of the present disclosure, the nanorod solar cell and the substrate are implemented as indium phosphide (InP).

According to an aspect of the present disclosure, the first layer is implemented as indium gallium arsenide (InGaAs).

As described above, according to an aspect of the present disclosure, it is possible to reduce manufacturing costs for a solar cell because a substrate that is used in a process of manufacturing a III-V group nanorod solar cell can be reused.

DETAILED DESCRIPTION

Figure 1:
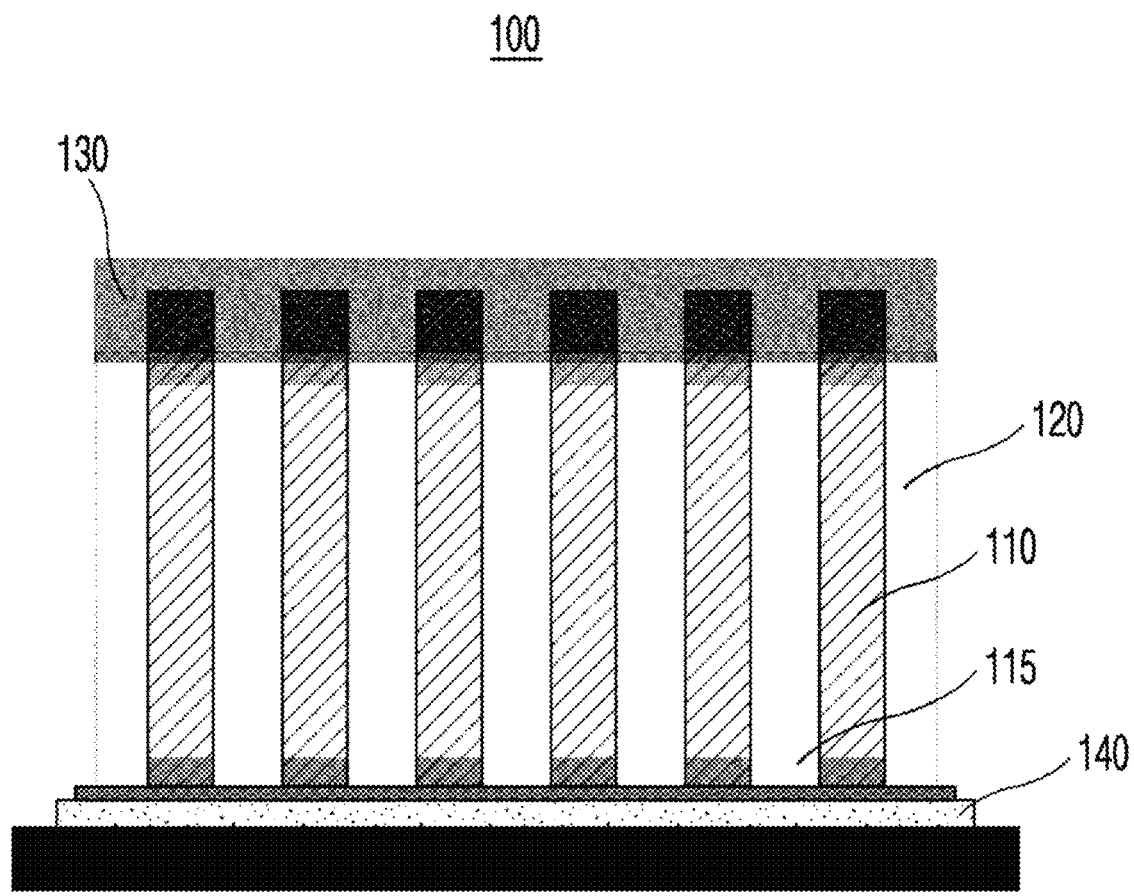
FIG. 1 is a diagram illustrating a construction of a solar cell according to an embodiment of the present disclosure.

The present disclosure may be changed in various ways and may have various embodiments. Specific embodiments are to be illustrated in the drawings and specifically described. It should be understood that the present disclosure is not intended to be limited to the specific embodiments, but includes all of changes, equivalents and/or substitutions included in the spirit and technical range of the present disclosure. Similar reference numerals are used for similar components while each drawing is described.

Terms, such as a first, a second, A, and B, may be used to describe various components, but the components should not be restricted by the terms. The terms are used to only distinguish one component from another component. For example, a first component may be referred to as a second component without departing from the scope of rights of the present disclosure. Likewise, a second component may be referred to as a first component. The term "and/or" includes a combination of a plurality of related and described items or any one of a plurality of related and described items.

When it is described that one component is "connected to" or "coupled to" the other component, it should be understood that one component may be directly connected or coupled to the other component, but a third component may exist between the two components. In contrast, when it is described that one component is "directly connected to" or "directly coupled to" the other component, it should be understood that a third component does not exist between the two components.

Terms used in this application are used to only describe specific embodiments and are not intended to restrict the present disclosure. An expression of the singular number includes an expression of the plural number unless clearly defined otherwise in the context. In this specification, a term, such as "include" or "have", is intended to designate the presence of a characteristic, a number, a step, an operation, a component, a part or a combination of them, and should be understood that it does not exclude the existence or possible addition of one or more other characteristics, numbers, steps, operations, components, parts, or combinations of them in advance.

All terms used herein, including technical terms or scientific terms, have the same meanings as those commonly understood by a person having ordinary knowledge in the art to which the present disclosure pertains, unless defined otherwise in the specification.

Terms, such as those defined in commonly used dictionaries, should be construed as having the same meanings as those in the context of a related technology, and are not construed as ideal or excessively formal meanings unless explicitly defined otherwise in the application.

Furthermore, each construction, process, procedure, or method included in each embodiment of the present disclosure may be shared within a range in which the constructions, processes, procedures, or methods do not contradict each other technically.

FIG. 1 is a diagram illustrating a construction of a solar cell according to an embodiment of the present disclosure.

Referring to FIG. 1, a solar cell 100 according to an embodiment of the present disclosure includes a (III-V group) nanorod solar cell 110, a solar cell protection layer 120, a transparent electrode 130, and an electrode 140.

The nanorod solar cell 110 has a form of a nanorod that grows in a pattern layer, and produces electric energy by receiving light.

The nanorod solar cell 110 is deposited or grown on an ($SiO_2$) pattern layer (will be described later with reference to FIGS. 4 and 5), and is grown in a rod form. A component that constitutes the nanorod solar cell 110 may be grown on a portion that belongs to each opening within the pattern layer and at which Au particles are located, by chemical vapor deposition, for example, a vapor-liquid-solid (VLS) method. Alternatively, the nanorod solar cell 110 may be grown in each opening within the pattern layer by a natural growth method attributable to a lattice mismatch.

The nanorod solar cell 110 that is grown as described above may have a form in which a III-V group component (e.g., GaAs or InP) has been implemented as a p-n junction, may have a form in which a p-i (undoped)-n junction has been implemented, or may have a form in which silicon (Si) has been included along with a p-n junction of a III-V group component.

The nanorod solar cell 110 produces electric energy by receiving light. The nanorod solar cells 110 are disposed to have a predetermined interval 115. Sunlight can be incident even between the intervals 115 because the nanorod solar cells 110 are disposed to have the interval 115. Each nanorod solar cell 110 can increase its generation quantity because sunlight that is incident between the intervals 115 can be additionally incident on the nanorod solar cell 110 in addition to sunlight that is incident from the top (i.e., a direction in which a transparent electrode is disposed) of the nanorod solar cell 110. Moreover, since the nanorod solar cell 110 has the rod form, the nanorod solar cell 110 can generate electricity by sufficiently receiving incident light although an incident angle of sunlight is changed due to a relative location change for the sun. As in a conventional technology, if light is slantly incident on a solar cell having a plane form due to a change in an incident angle of sunlight, it is difficult for the solar cell to sufficiently receive the incident light because reflection occurs on a surface of the solar cell. In contrast, since the nanorod solar cell 110 has the rod form, a change in the light-receiving rate according to a change in the incident angle is minimized. According to such a characteristic, the solar cell 100 in which the solar cells 110 each having the rod form are disposed to have the interval may be lower in a total generation quantity than the conventional solar cell because the intervals 115 are formed within the solar cell 100, but power generation efficiency of only the nanorod solar cell 110 is much higher than that of the conventional solar cell.

The solar cell protection layer 120 is disposed on the outsides of the nanorod solar cells 110 in a form in which the solar cell protection layer surrounds each nanorod solar cell 110. The solar cell protection layer 120 is implemented as a material that is transparent or transfers, to the nanorod solar cell, light that is incident thereon by transmitting the light, that is not etched by an etchant for a sacrificial layer, and that has a non-conductive characteristic. For example, the solar cell protection layer 120 may be a silicon-series compound, such as polydimethylsiloxane (PDMS). In particular, the solar cell protection layer 120 may have the aforementioned characteristics and also have elasticity and flexibility having a preset reference value or higher. The solar cell protection layer 120 is disposed in a form in which the solar cell protection layer surrounds the nanorod solar cells 110, and it protects the nanorod solar cells 110 against the outside and enables the nanorod solar cells 110 to maintain the interval 115.

The solar cell protection layer 120 may include a wavelength conversion fluorescent substance or a wavelength conversion dye therein. The nanorod solar cell 110 does not produce electric energy by receiving light having all wavelength bands, but may produce electric energy from light having a specific wavelength band. For example, the solar cell 100 may produce electric energy from light having a visible light wavelength band, and does not produce electric energy although the solar cell 100 receives light having an ultraviolet wavelength band. The solar cell protection layer 120 may include the wavelength conversion fluorescent substance or the wavelength conversion dye that receives a wavelength band from which the solar cell 100 does not produce electric energy although the solar cell 100 receives the wavelength band and that converts the received wavelength band into a wavelength band from which the solar cell 100 can produce electric energy. Accordingly, the solar cell protection layer 120 can perform the aforementioned operation and also improve power generation efficiency of the nanorod solar cell 110.

The transparent electrode 130 is disposed on one side (i.e., a direction in which sunlight is incident) of the nanorod solar cells 110. The transparent electrode 130 receives a current that is generated by the nanorod solar cell 110, and transfers the current (to the outside). The transparent electrode 130 electrically connects the nanorod solar cell 110 and an electric condenser (not illustrated) in which a current that is generated by the nanorod solar cell 110 will be stored by electrically connecting the nanorod solar cells 110.

The electrode 140 is disposed on the other side of the nanorod solar cells 110. Like the transparent electrode 130, the electrode 140 receives a current that is generated by the nanorod solar cell 110, and transfers the current (to the outside). Like the transparent electrode 130, the electrode 140 also electrically connects the nanorod solar cell 110 and the electric condenser (not illustrated) so that a current that is generated by the nanorod solar cell 110 can be stored in the electric condenser (not illustrated).

The solar cell 100 having such a structure is manufactured as follows based on a component that forms the nanorod solar cell 110. In this case, in a process of manufacturing the solar cell, the time for which an etchant and a substrate come into contact with each other is reduced as much as possible, so that the substrate for which the process of manufacturing the solar cell 100 has been finished can be used in a process of manufacturing (another) solar cell again. The solar cell 100 is manufactured by a process to be described later with reference to FIGS. 2 to 8 or 9 to 14.

FIGS. 2 to 8 are diagrams illustrating a process of manufacturing a III-V group nanorod solar cell according to a first embodiment of the present disclosure.

A process of manufacturing the nanorod solar cell 110 that is implemented as a gallium arsenide (GaAs) component or series thereof is described as the process of manufacturing a III-V group nanorod solar cell according to the first embodiment of the present disclosure with reference to FIGS. 2 to 8.

Figure 2:
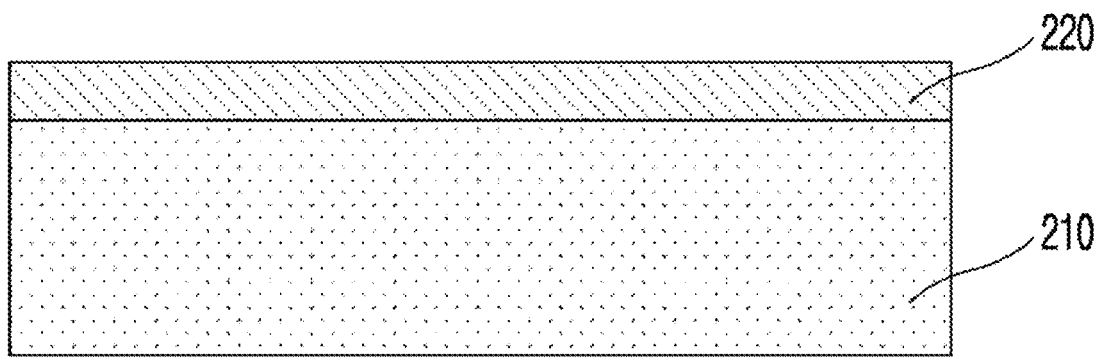
FIGS. 2, 3, 4, 5, 6A, 6B, 7A, 7B and 8 are diagrams illustrating a process of manufacturing a III-V group nanorod solar cell according to a first embodiment of the present disclosure.

Referring to FIG. 2, an etch stop layer 220 is grown on a substrate 210. In this case, the substrate 210 is implemented as gallium arsenide (GaAs) or series thereof so that the etch stop layer can have the same lattice constant as a solar cell having a gallium arsenide component. The etch stop layer is implemented as gallium indium phosphide (GaInP) so that the etch stop layer is grown on the substrate 210.

Figure 3:
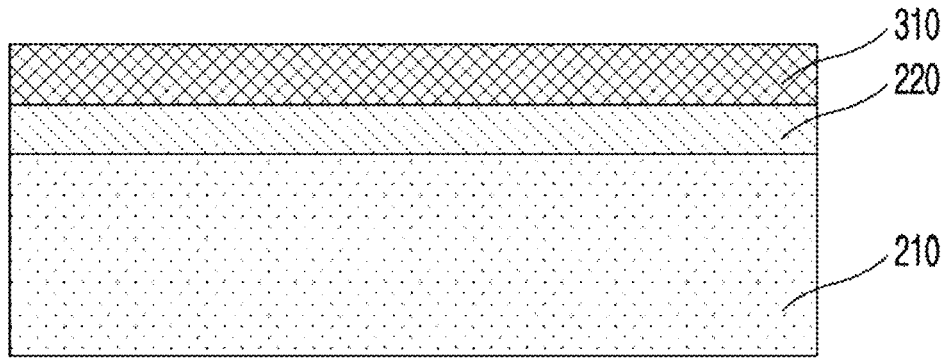

Referring to FIG. 3, a sacrificial layer 310 is grown on the etch stop layer 220. The sacrificial layer 310 is also implemented as a component that has the same lattice constant as the substrate 210 and the etch stop layer 220 and that can be grown on the etch stop layer 220. Specifically, the sacrificial layer 310 may be implemented as aluminum arsenide (AlAs).

Figure 4:
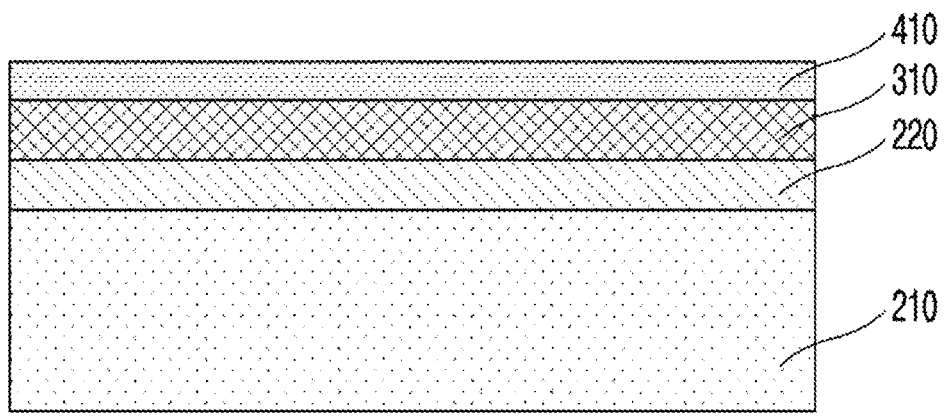

Referring to FIG. 4, a pattern layer 410 is grown on the sacrificial layer 310. The pattern layer 410 is implemented as $SiO_2$, and has an opening (not illustrated) at each location at which each nanorod solar cell can be grown as described with reference to FIG. 1. The number of openings within the pattern layer 410 corresponds to the number of nanorod solar cells to be grown.

Figure 5:
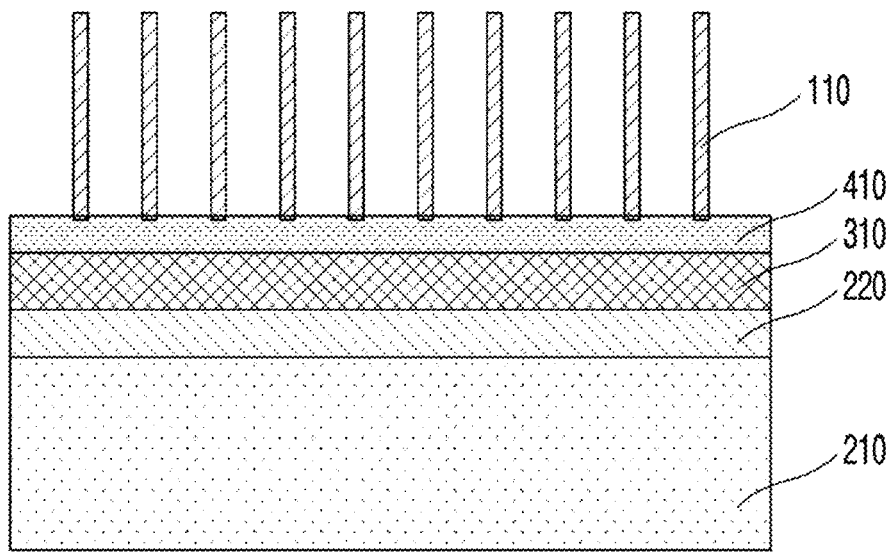

Referring to FIG. 5, the nanorod solar cell 110 is deposited or grown from each opening (not illustrated) within the pattern layer 410. As described above, the component (GaAs) that constitutes the nanorod solar cell 110 is deposited through chemical vapor and deposited through each opening (not illustrated) or is naturally grown. Each nanorod solar cell 110 is deposited on the sacrificial layer 310 or is grown on the sacrificial layer 310, and is grown in a rod form through the opening within the pattern layer 410.

Figure 6A:
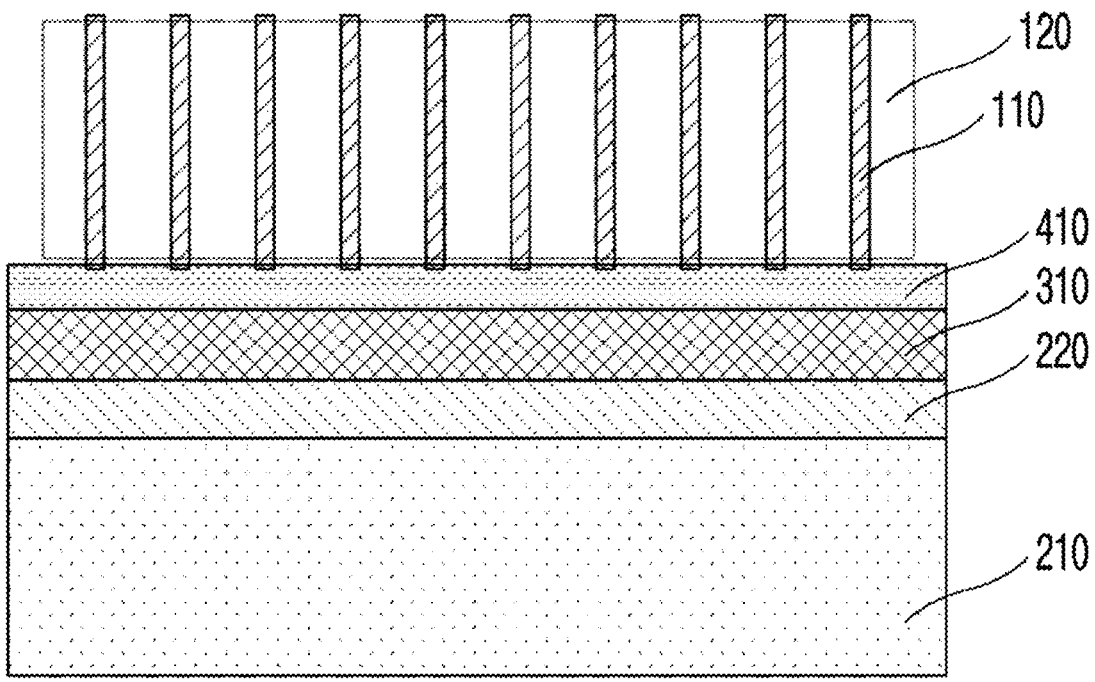

Referring to FIG. 6A, the solar cell protection layer 120 is formed on the outsides of the grown nanorod solar cells 110. The solar cell protection layer 120 may be formed on the outsides of the nanorod solar cells 110 prior to an etching process to be described later with reference to FIG. 6B, after the nanorod solar cells 110 are grown. Accordingly, the solar cell protection layer 120 is disposed on the outsides of all of the nanorod solar cells 110.

Figure 6B:
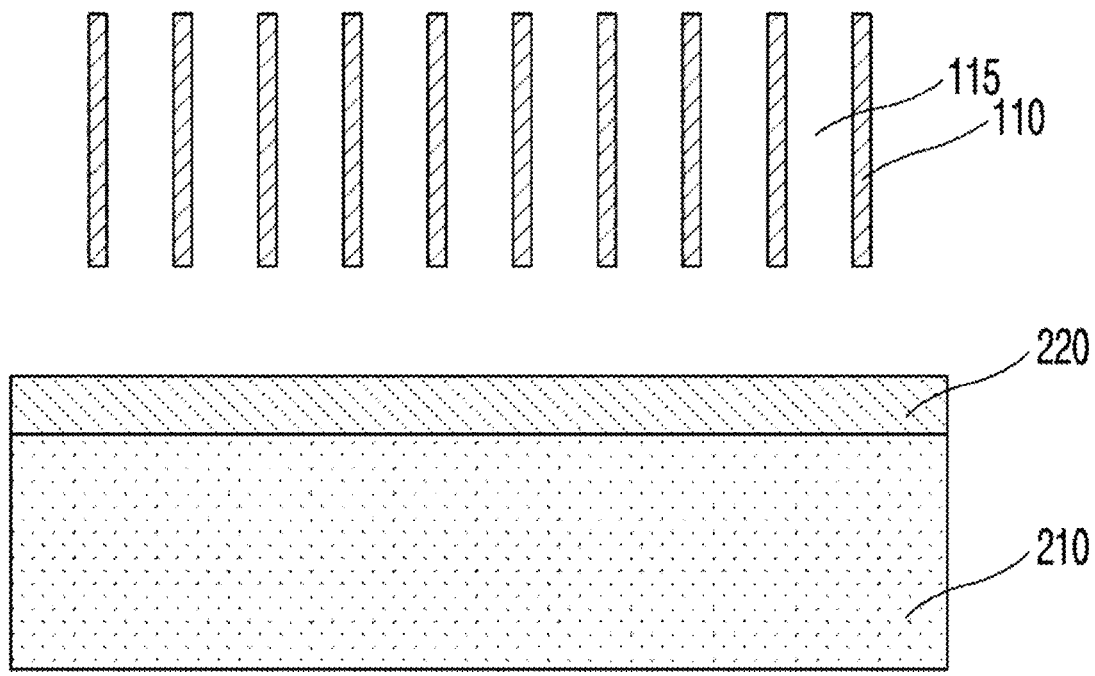

Alternatively, referring to FIG. 6B, after the nanorod solar cells 110 are grown on the sacrificial layer 310, the pattern layer 410 and the sacrificial layer 310 are etched. The pattern layer 410 and the sacrificial layer 310 are etched by an etchant. At this time, the etchant may be introduced into each interval 115 because the interval 115 is formed between the nanorod solar cells 110. The etching of the pattern layer 410 and the sacrificial layer 310 may be simultaneously performed on the intervals in addition to the outsides of the nanorod solar cells 110 because the etchant may also be introduced into the intervals. Accordingly, an etching time for the pattern layer 410 and the sacrificial layer 310 can be significantly reduced. The etching process that requires several hours to several tens of hours can be reduced to several minutes.

In this case, the etchant is implemented as a component capable of etching the sacrificial layer 310 and the pattern layer 410 while minimizing a reaction with the grown nanorod solar cell 110, and may be an HF mixture, for example.

Figure 7A:
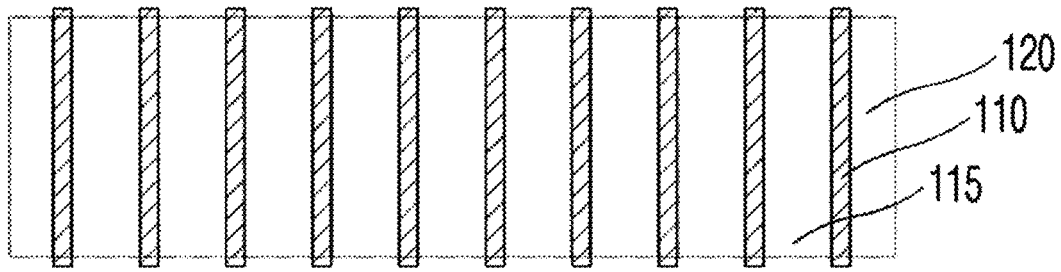
Figure 7A:
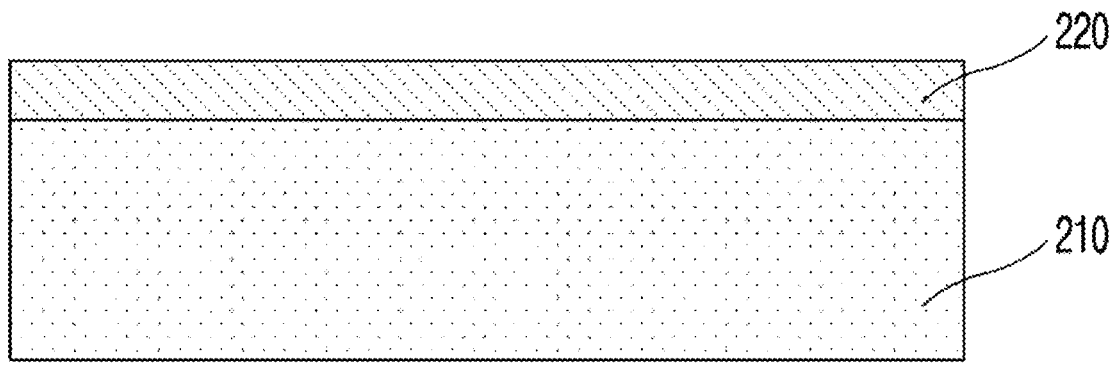

Referring to FIG. 7A, after the solar cell protection layer 120 is formed, the pattern layer 410 and the sacrificial layer 310 are etched by the etchant. Since the solar cell protection layer 120 has been formed, etching is not performed immediately simultaneously after the etchant is introduced. However, when the etching of the pattern layer 410 starts to be performed from the outsides of the nanorod solar cells 110, the etching may be simultaneously performed on the sacrificial layer 310 through the openings formed in the pattern layer 410. Accordingly, the etching of the pattern layer 410 and the sacrificial layer 310 can be significantly reduced compared to a conventional manufacturing process.

Figure 7B:
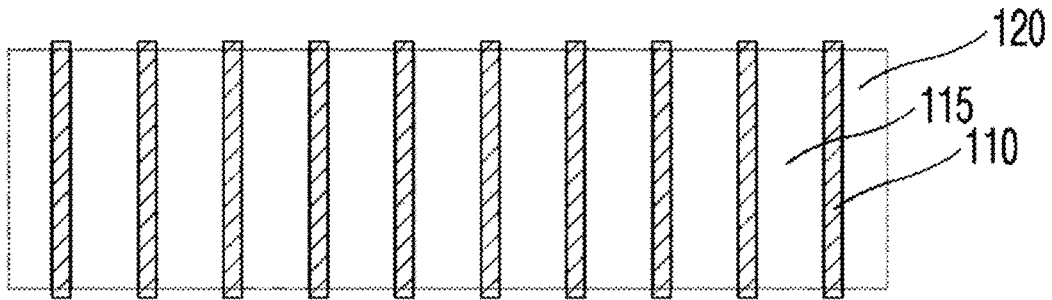
Figure 7B:
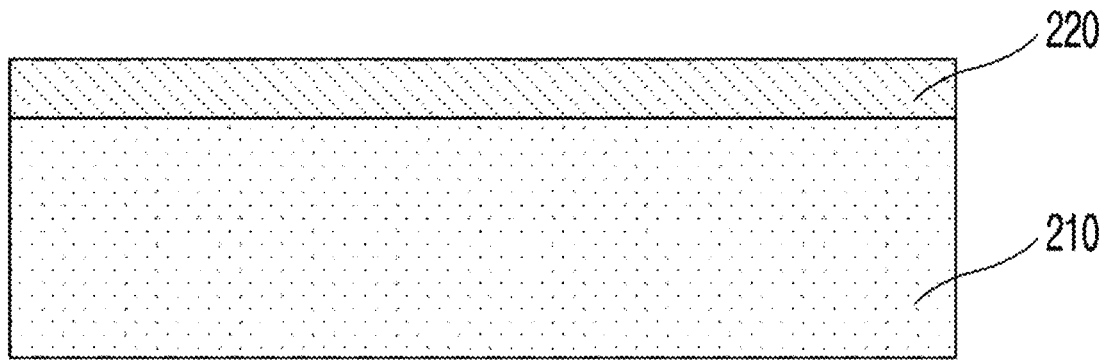

Referring to FIG. 7B, after the pattern layer 410 and the sacrificial layer 310 are etched, the solar cell protection layer 120 is formed on the outsides of the nanorod solar cells 110. After the pattern layer 410 and the sacrificial layer 310 are etched, the nanorod solar cells 110 are disposed to have the predetermined interval 115. After the nanorod solar cells 110 are disposed as described above, the solar cell protection layer 120 is formed on the outsides of the nanorod solar cells 110.

The nanorod solar cell 110 in which the solar cell protection layer 120 has been formed is manufactured as the solar cell 100 through a separate process. The nanorod solar cell 110 needs to be connected to the transparent electrode 130 on one side thereof and to the electrode 140 on the other side thereof. Accordingly, a part of the solar cell protection layer 120, which is located at each end (toward the transparent electrode or the electrode) of the nanorod solar cell 110, is etched. Accordingly, the nanorod solar cell 110 in which the solar cell protection layer 120 has been formed may be connected to each electrode 130 or 140, and may be manufactured as the solar cell 100.

Figure 8:
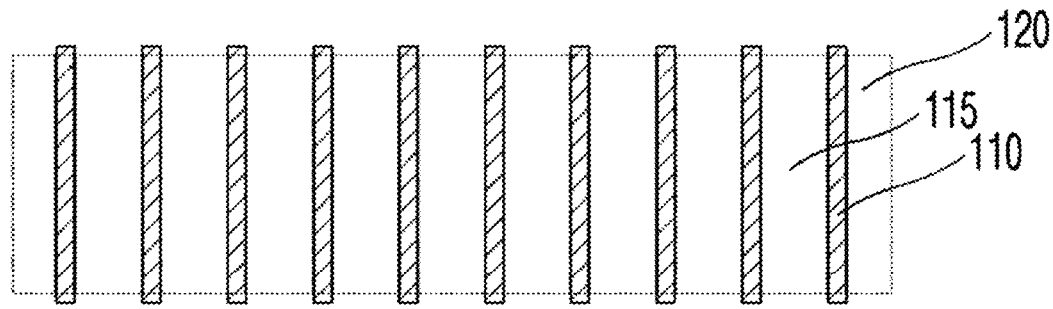
Figure 8:
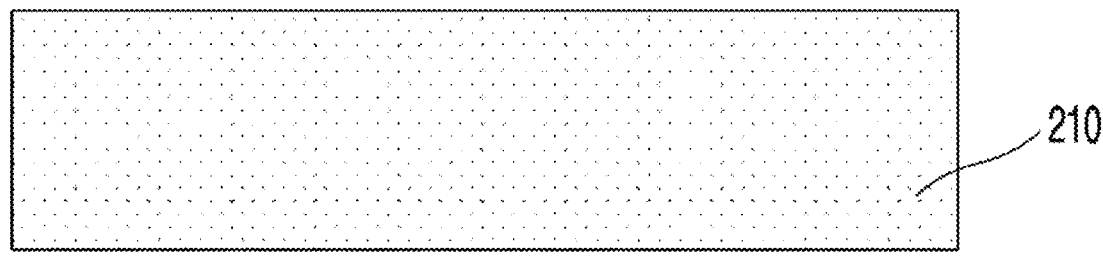

Referring to FIG. 8, etching is performed on the etch stop layer 220 that has been grown on the substrate 210. In order to reuse the substrate 210, the etching is also performed on the etch stop layer 220 that has been grown on the substrate 210. The etching of the etch stop layer 220 may be performed by a hydrochloric acid (HCL)-series etchant.

As described with reference to FIG. 6B or 7A, in the process of manufacturing a III-V group nanorod solar cell according to the first embodiment of the present disclosure, the time for which the etchant and the substrate come into contact with each other is reduced several tens of times to several hundreds of times compared to a conventional technology. Accordingly, a change in the properties of the substrate attributable to a contact with the etchant is minimized. Accordingly, the substrate 210 on which up to the process described with reference to FIG. 8 has been performed can be reused again in a process of manufacturing another solar cell.

FIGS. 9 to 13 are diagrams illustrating a process of manufacturing a III-V group nanorod solar cell according to a second embodiment of the present disclosure.

A process of manufacturing the nanorod solar cell 110 that is implemented as an indium phosphide (InP) component or series thereof is described as the process of manufacturing a III-V group nanorod solar cell according to the second embodiment of the present disclosure with reference to FIGS. 9 to 13.

Figure 9:
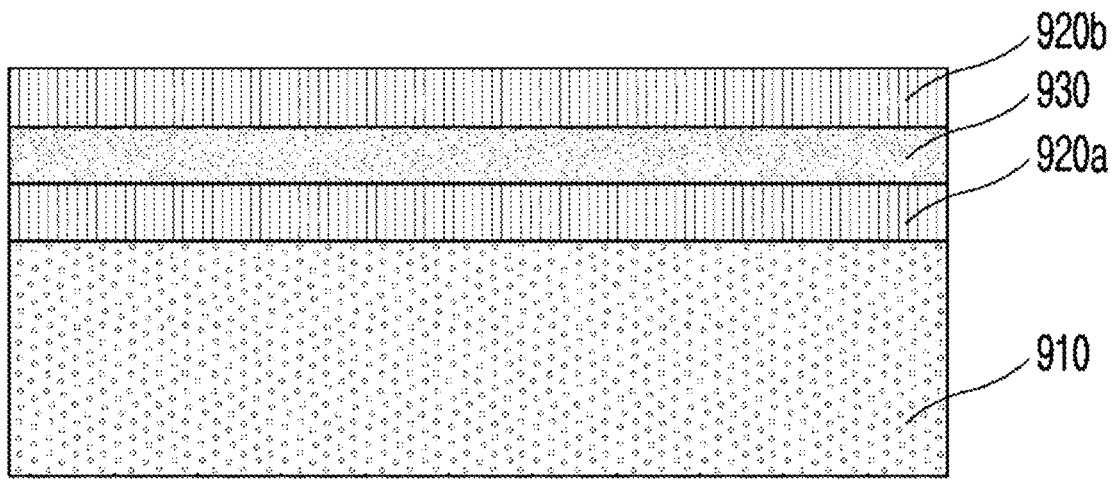
FIGS. 9, 10, 11, 12A, 12B, 13A, 13B, and 14 are diagrams illustrating a process of manufacturing a III-V group nanorod solar cell according to a second embodiment of the present disclosure.

Referring to FIG. 9, a plurality of layers 920 and 930 that play roles as an etch stop layer and a sacrificial layer is grown on a substrate 910. In this case, since the nanorod solar cell 110 is implemented as the InP component, the substrate 910 is implemented as indium phosphide (InP) so that the substrate 910 has the same lattice constant as the nanorod solar cell.

Since the substrate 910 is implemented as the InP component, an indium gallium arsenide (InGaAs) layer 920a and an indium phosphide (InP) layer 930 each having the same lattice constant as the nanorod solar cell 110 and the substrate 910 are grown on the substrate 910 as a layer that will play a role as the etch stop layer.

An InGaAs layer 920b is grown on the InP layer 930 again as a layer that will play a role as the sacrificial layer.

Figure 10:
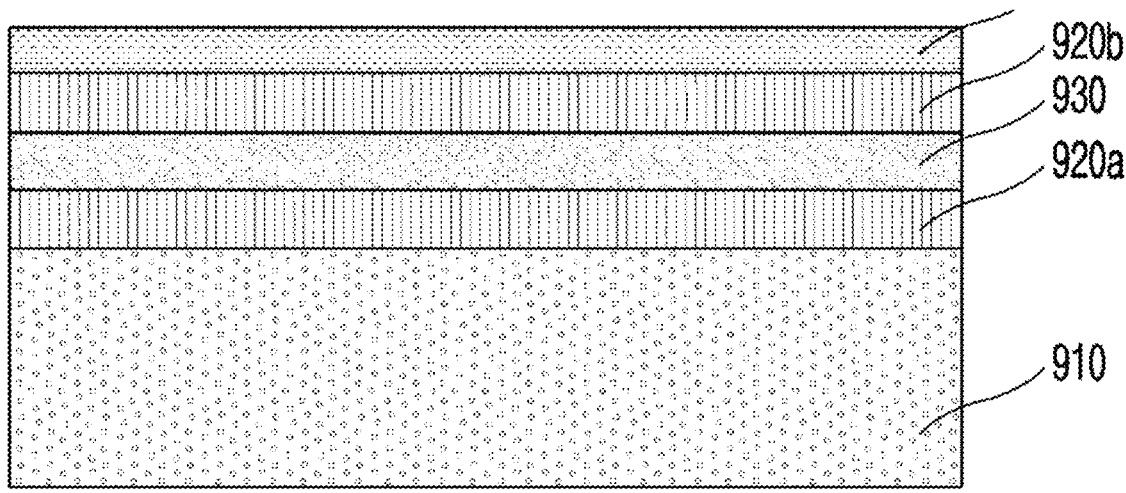

Referring to FIG. 10, a pattern layer 410 is grown on the InGaAs layer 920b.

Figure 11:
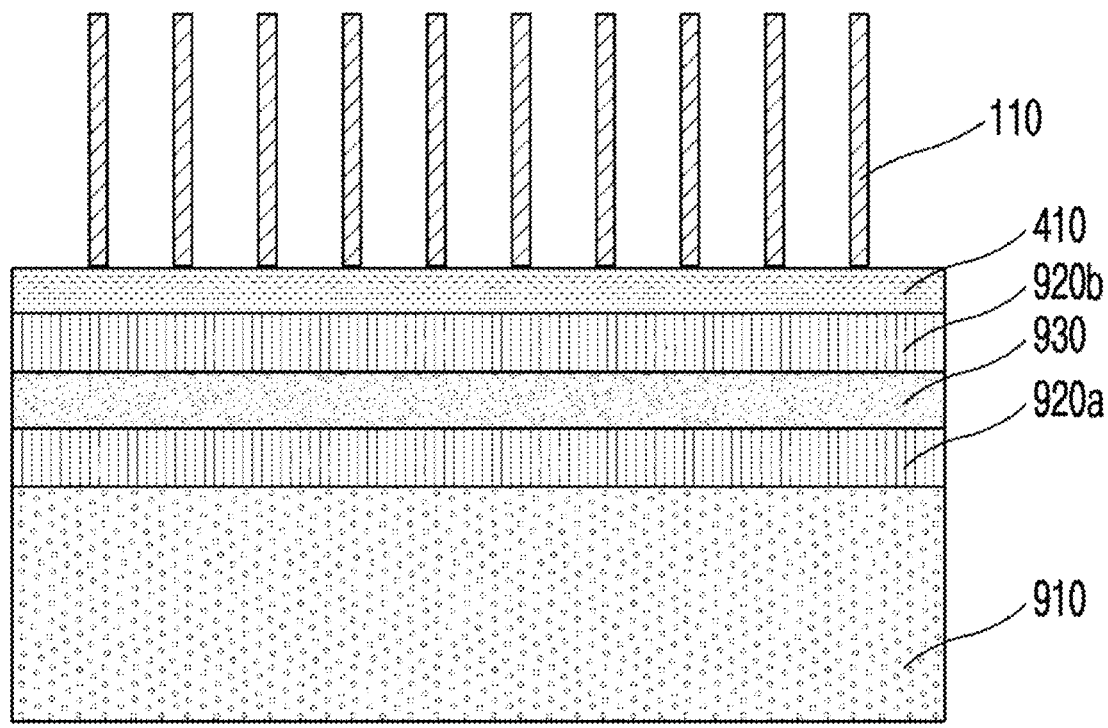

Referring to FIG. 11, the nanorod solar cell 110 is deposited or grown through each opening (not illustrated) within the pattern layer 410. Each nanorod solar cell 110 is deposited on the InGaAs layer 920b or grown on the InGaAs layer 920b, and is grown in a rod form through the opening within the pattern layer 410.

Figure 12A:
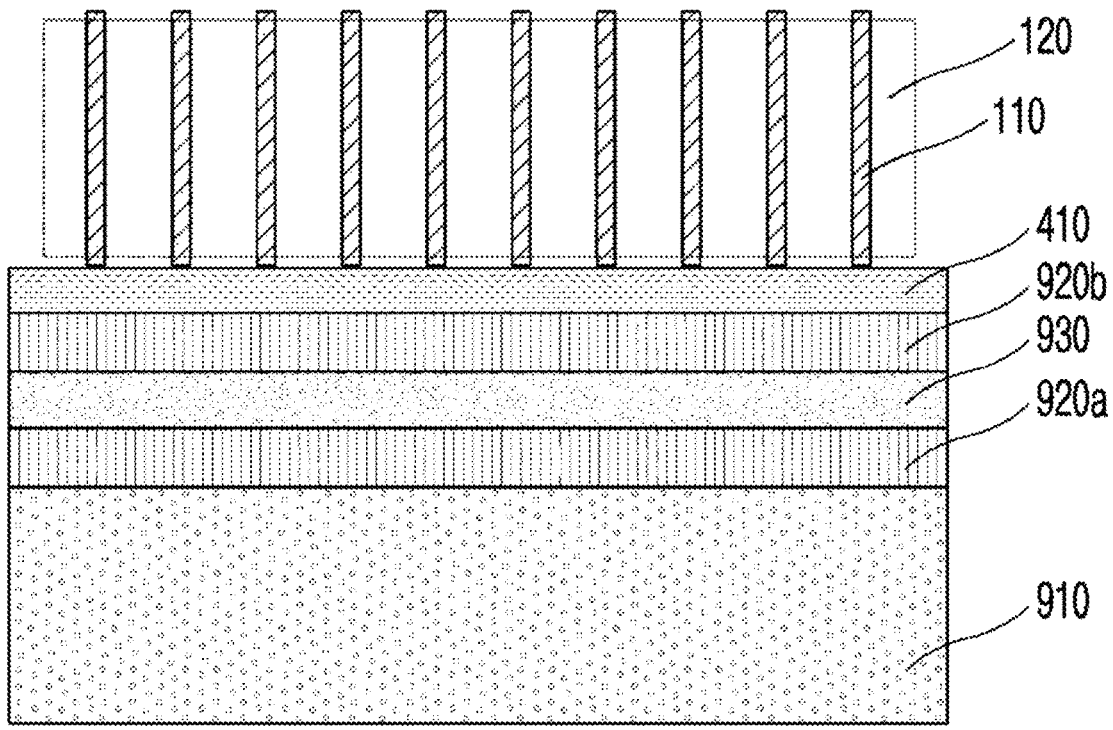

Referring to FIG. 12A, the solar cell protection layer 120 is formed in the outsides of the grown nanorod solar cells 110.

Figure 12B:
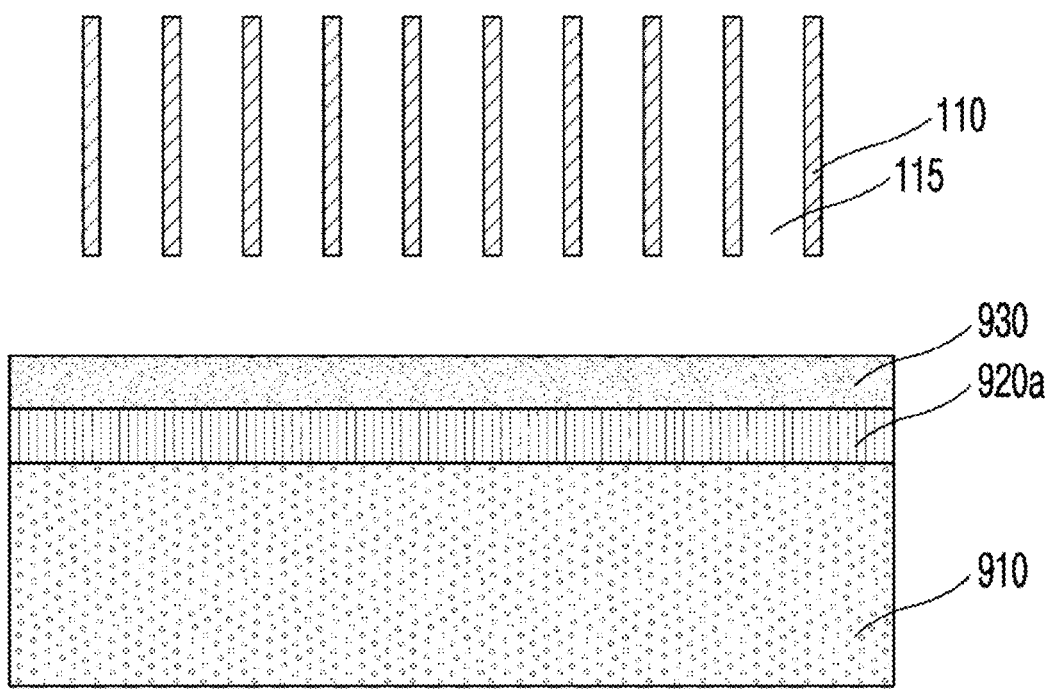

Alternatively, referring to FIG. 12B, after the solar cells 110 are grown on the InGaAs layer 920b, the pattern layer 410 and the InGaAs layer 920b are etched by an etchant. Like the etchant in the first embodiment, the etchant in the second embodiment is implemented as a component capable of etching the pattern layer 410 and the InGaAs layer 920b while minimizing a reaction with the grown nanorod solar cell 110, and may be a HF mixture, for example.

Figure 13A:
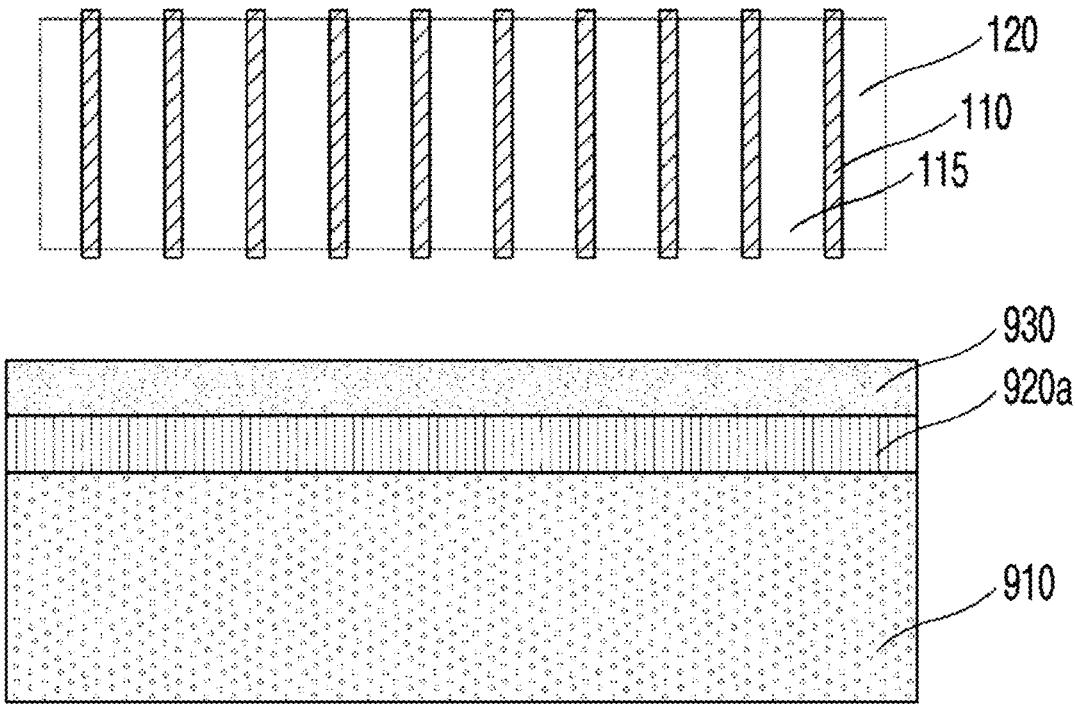

Referring to FIG. 13A, after the solar cell protection layer 120 is formed, the pattern layer 410 and the InGaAs layer 920b are etched by the etchant.

Figure 13B:
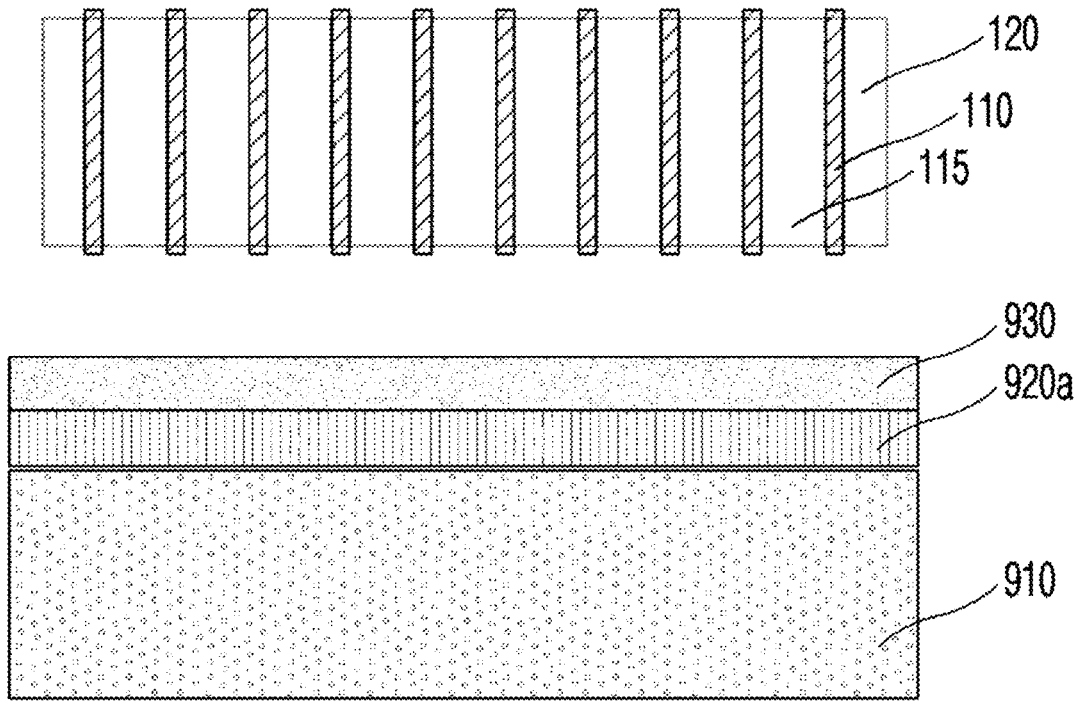

Referring to FIG. 13B, after the pattern layer 410 and the InGaAs layer 920b are etched, the solar cell protection layer 120 is formed on the outsides of the nanorod solar cells 110.

The nanorod solar cell 110 in which the solar cell protection layer 120 has been formed is manufactured as the solar cell 100 through a separate process. As in the first embodiment, the nanorod solar cell 110 needs to be connected to the transparent electrode 130 on one side thereof and to the electrode 140 on the other side thereof. Accordingly, a part of the solar cell protection layer 120, which is located at each end (toward the transparent electrode or the electrode) of the nanorod solar cell 110, is etched. Accordingly, the nanorod solar cell 110 in which the solar cell protection layer 120 has been formed may be connected to each electrode 130 or 140, and may be manufactured as the solar cell 100.

Figure 14:
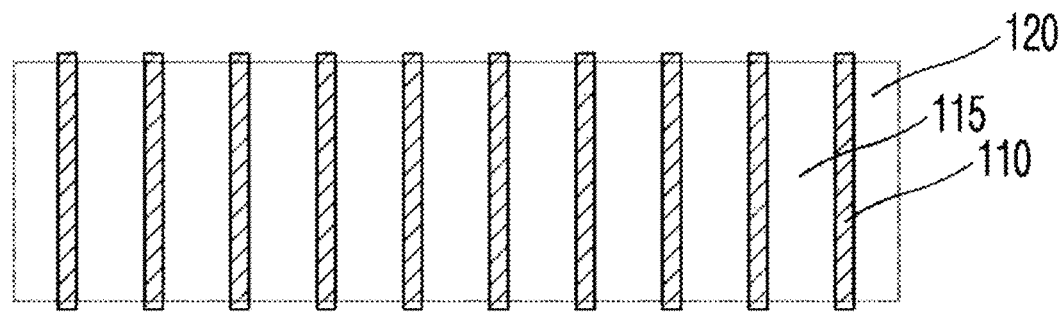
Figure 14:
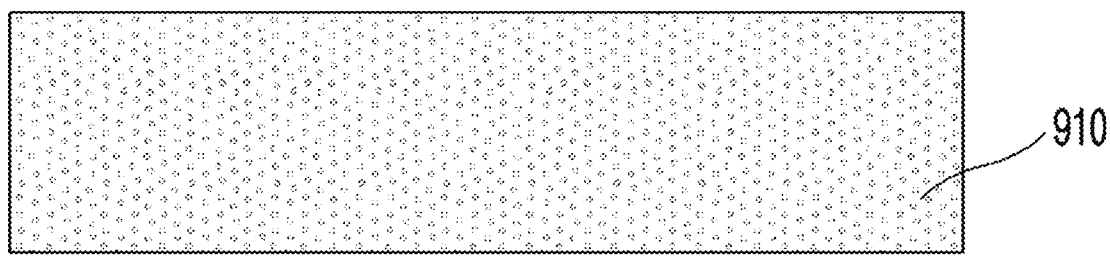

Referring to FIG. 14, the InGaAs layer 920a and the InP layer 930 that have been grown the substrate 210 are etched. As in the first embodiment, the etching may be performed by an hydrochloric acid (HCL)-series etchant.

As in the first embodiment, even in the process of manufacturing a III-V group nanorod solar cell according to the second embodiment of the present disclosure, the time for which the etchant and the substrate come into contact with each other is reduced several tens of times to several hundreds of times compared to a conventional technology. Accordingly, a change in the properties of the substrate attributable to a contact with the etchant is minimized, and the substrate can be reused.

The above description is merely a description of the technical spirit of the present embodiment, and those skilled in the art may change and modify the present embodiment in various ways without departing from the essential characteristic of the present embodiment. Accordingly, the embodiments should not be construed as limiting the technical spirit of the present embodiment, but should be construed as describing the technical spirit of the present embodiment. The technical spirit of the present embodiment is not restricted by the embodiments. The range of protection of the present embodiment should be construed based on the following claims, and all of technical spirits within an equivalent range of the present embodiment should be construed as being included in the scope of rights of the present embodiment.

What is claimed is:

1. A method of manufacturing a plurality of nanorod solar cells so that a substrate is able to be reused, the method comprising:
   a first growth process of forming an etch stop layer on a substrate;
   a second growth process of growing a sacrificial layer on the etch stop layer;
   a third growth process of forming, on the sacrificial layer, a pattern layer comprising an opening at each location at which each nanorod solar cell is able to be grown;
   a fourth growth process of growing the nanorod solar cells on the sacrificial layer through the openings within the pattern layer;
   a forming process of forming a solar cell protection layer on outsides of the nanorod solar cells;
   a first etching process of etching the sacrificial layer and the pattern layer; and
   a second etching process of etching the etch stop layer.

2. The method of claim 1, wherein the nanorod solar cell is implemented as gallium arsenide (GaAs).

3. The method of claim 2, wherein the substrate is implemented as a component identical with the component of the nanorod solar cell.

4. The method of claim 1, wherein the solar cell protection layer is implemented as a component that is transparent and that has a non-conductive characteristic.

5. A method of manufacturing a plurality of nanorod solar cells so that a substrate is able to be reused, the method comprising:
   a first growth process of forming an etch stop layer on a substrate;
   a second growth process of growing a sacrificial layer on the etch stop layer;
   a third growth process of forming, on the sacrificial layer, a pattern layer comprising an opening at each location at which each nanorod solar cell is able to be grown;
   a fourth growth process of growing the nanorod solar cells on the sacrificial layer through the openings within the pattern layer;
   a first etching process of etching the sacrificial layer and the pattern layer;
   a forming process of forming a solar cell protection layer on outsides of the nanorod solar cells after the nanorod solar cells on which the first etching process has been performed are disposed to have a preset interval; and
   a second etching process of etching the etch stop layer.

6. The method of claim 5, wherein the solar cell protection layer is a silicon compound.

7. The method of claim 5, wherein in the first etching process, the sacrificial layer and the pattern layer are etched by an HF mixture.

8. A method of manufacturing a plurality of nanorod solar cells so that a substrate is able to be reused, the method comprising:
   a first growth process of sequentially growing, on a substrate, a first layer implemented as a component having a lattice constant identical with a lattice constant of a nanorod solar cell to be manufactured, a second layer implemented as a component identical with a component of the substrate, and a third layer implemented as the same component as the first layer;
   a second growth process of growing, on the third layer, a pattern layer comprising an opening at each location at which each nanorod solar cell is able to be grown;
   a third growth process of growing the nanorod solar cells on the third layer through the openings within the pattern layer;
   a forming process of forming a solar cell protection layer on outsides of the nanorod solar cells;
   a first etching process of etching the third layer and the pattern layer; and
   a second etching process of etching the first layer and the second layer.

9. The method of claim 8, wherein the nanorod solar cell and the substrate are implemented as indium phosphide (InP).

10. The method of claim 8, wherein the first layer is implemented as indium gallium arsenide (InGaAs).

11. The method of claim 8, wherein the solar cell protection layer is implemented as a component that is transparent and that has a non-conductive characteristic.

12. The method of claim 8, wherein the forming process is performed after the nanorod solar cells on which the first etching process has been performed are disposed to have a preset interval.

* * * * *